United States Patent
Suzuki et al.

(10) Patent No.: US 6,379,986 B1
(45) Date of Patent: Apr. 30, 2002

(54) METHOD OF FORMING TUNNEL OXIDE FILM FOR SUPERCONDUCTING X-RAY SENSOR ELEMENT

(75) Inventors: Hiroyuki Suzuki; Masao Hasegawa, both of Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/778,462

(22) Filed: Feb. 7, 2001

(51) Int. Cl.⁷ .............................................. H01L 21/00
(52) U.S. Cl. .......................... 438/48; 438/56; 438/263
(58) Field of Search .......................... 438/690, 694, 438/56, 48, 263

(56) References Cited

U.S. PATENT DOCUMENTS

| 4,535,343 A | * | 8/1985 | Wright et al. | 346/140 |
| 5,545,612 A | * | 8/1996 | Mizushima et al. | 505/239 |
| 6,279,476 B1 | * | 8/2001 | Ellis | 101/454 |

* cited by examiner

*Primary Examiner*—John F. Niebling
*Assistant Examiner*—Christopher Lattin
(74) *Attorney, Agent, or Firm*—Adams & Wilks

(57) ABSTRACT

To produce a high quality tunnel oxidation film on a bulk superconductor surface.

A tunnel oxidation film is formed by anodizing a bulk aluminum material and then a tunnel oxidation film is formed by irradiating oxygen ions.

3 Claims, 1 Drawing Sheet

METHOD OF FORMING TUNNEL OXIDE FILM FOR SUPERCONDUCTING X-RAY SENSOR ELEMENT

BACKGROUND OF THE INVENTION

1. Field of the Invention

The present invention relates to a method of forming a tunnel oxide film of a superconducting tunnel junction type X-ray sensor element used in an X-ray detector for measuring an X-ray energy spectrum.

2. Description of the Prior Art

An X-ray detector of the related art using a superconducting tunnel junction, as shown in FIG. 2, has a tunnel oxide film (not shown in the drawings) formed on a surface of a first superconducting thin film 5 formed on a substrate 4, and has a second superconducting thin film 6 formed on the first superconducting thin film 5.

As a method of forming a tunnel oxide film of the related art, there is a method of introducing gas containing oxygen into a vacuum chamber immediately after forming the first superconducting thin film 5, and then oxidizing the first superconducting thin film 5 by leaving it as it is for a fixed period of time at close to room temperature.

It is also possible to carry out oxidation by generating plasma inside the gas containing oxygen.

However, with the structure of the related art, since the first superconducting thin film 5 is a sputtered film or a vapor deposited film, it has a maximum thickness in the order of 1 $\mu$m. Because X-rays have a large permeating force, at this thickness a sufficient X-ray absorption efficiency is not obtained and as an X-ray detector there is insufficient detection efficiency.

For example, aluminum with a thickness of 1 $\mu$m has an X-ray absorption efficiency of less than about 3% for the energy of fluorescent X-rays of iron atoms that are to be analyzed.

In trials, sufficient X-ray absorption efficiency has been confirmed in the related art by replacing the first superconducting thin film 5 with a bulk superconductor, but it has not been possible to form a high quality tunnel oxidation film on a bulk superconductor surface.

It is necessary to coat a tunnel oxidation film uniformly with a thickness of a few nm.

Uniformity can be evaluated by measuring surface roughness, and it is necessary for an average surface roughness value Ra to be in the same order as the film thickness, or less.

SUMMARY OF THE INVENTION

In order to address the above described problems, oxygen ions are irradiated to form a tunnel oxidation film after anodizing a surface of a bulk aluminum material.

DETAILED DESCRIPTION OF THE PREFERRED EMBODIMENTS

If a bulk aluminum material surface is anodized, an amorphous oxidation aluminum layer called a barrier oxidation film is formed at a region close to the aluminum.

If oxygen ions having an energy in the order of 0.5–10 keV are irradiated to the surface of this barrier oxidation film, oxygen ions are injected to a depth of a few nm at the same time as etching.

Uniform etching is realized by forming not an oxidation film having a lot of defects, such as a natural oxidation film, but a uniform amorphous barrier oxidation film by anodizing.

Once etching using oxygen ions of the amorphous barrier oxidation film formed by anodizing has been completed, formation and etching of a tunnel oxidation film using oxygen ions injected into the aluminum, advance simultaneously.

What is being etched is the amorphous aluminum oxide, and uniform etching is possible because it is unlikely to be affected by the orientation of crystal grain of the bulk aluminum material, the grain boundary, and defects less than a few nm.

Thickness of the oxidation film balancing the case where oxygen ions having an energy of around 0.5–10 keV are irradiated is a few nm, and is consistent with a suitable thickness for a tunnel oxidation film.

In the case of etching with chemically inert gas ions, for example, argon ions, uniform etching is not possible.

Also, even if a bulk aluminum material covered with a natural oxidation film is etched using oxygen ions, uniform etching is difficult because of defects within the thin natural oxidation film.

After smoothing by electropolishing, even if a barrier anodizing coating is formed, the effect is the same.

A method of forming the amorphous barrier anodizing coating is well known as a processing method for an aluminum electrolytic capacitor.

The barrier anodizing coating is extremely effective as an insulator, and if oxygen ions are converged so as to irradiate the barrier anodizing coating, it is possible to form a tunnel junction region and a tunnel oxidation film at the same time.

Figure 1:
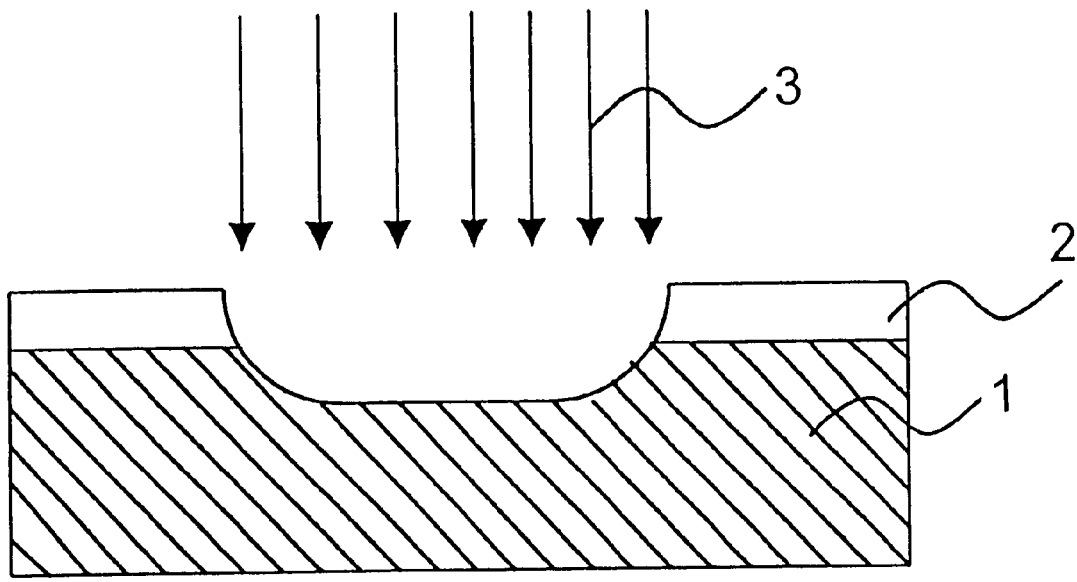
FIG. 1 is a cross sectional drawing for describing an embodiment of the present invention.
Figure 2:
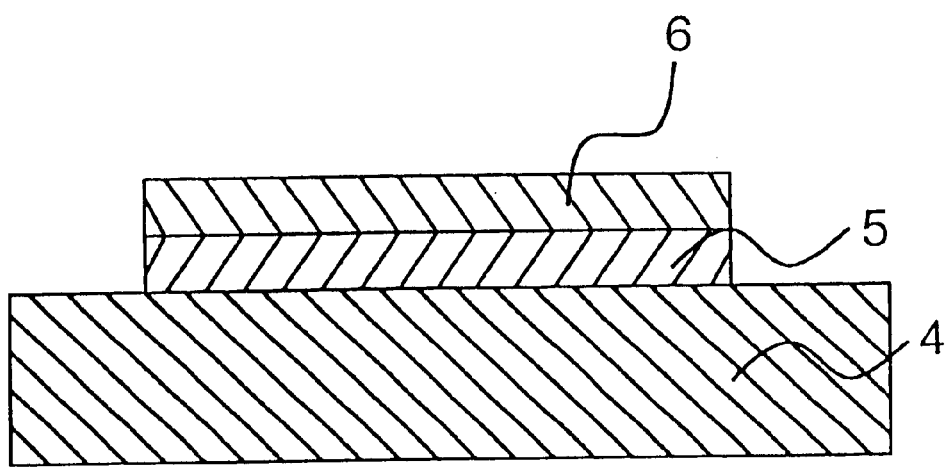
FIG. 2 is a cross sectional drawing of an X-ray sensor element of the related art.

FIG. 1 is a cross sectional drawing of an embodiment of the present invention.

After degreasing of the surface of the bulk aluminum material 1, smoothing is performed by electropolishing so as to remove processing defects.

Electropolishing is carried out using an electropolishing fluid that is a solution of sodium phosphate (50 g/l)-anhydrous sodium carbonate (150 g/l), and at a voltage of 10V and a temperature of 75° C.

Next, anodizing is carried out inside ammonium borate solution (0.05 mol/l), at a voltage of 10V and at room temperature.

Under the conditions of this embodiment, a barrier oxidation coating 2 of about 0.1 $\mu$m is formed.

Even if electrolytic solution for forming a porous oxidation coating, such as sulfuric acid, is used, the effect is the same because the barrier oxidation coating is formed in the vicinity of the aluminum.

Next, oxygen ions 3 are irradiated to the surface of the bulk superconductor. An oxygen ion gun of a secondary ion mass spectrometer is used in the irradiation of the oxygen ions 3.

The energy of the oxygen ions 3 is 2.5 keV, current is 20 nA, and beam diameter is 25 $\mu$m.

A suitable energy of the oxygen ions 3 is around 0.5–5 keV, but if it is in this energy range it is also possible to use an ion beam etching device handling inert gas as well as substrate etching gas of a sputtering device that introduces oxygen gas.

When the oxygen ion gun of a secondary ion mass spectrometer is used under the above described conditions, it is possible to obtain a high quality tunnel oxidation film having a surface roughness of about 2 nm and an oxidation film thickness of a few nm.

In order to use as an X-ray sensor element, more aluminum is vapor deposited as an upper electrode.

In this embodiment, a barrier oxidation coating having very good insulation properties is formed, and a converged oxygen ion beam is used using an oxygen ion gun of a secondary ion mass spectrometer, which means that formation of a tunnel junction region surrounding the circumference at the insulating film, and production of a tunnel oxidation film can be carried out at the same time.

According to the present invention, after anodizing of a surface of a bulk aluminum material, a high quality tunnel oxidation film is produced by irradiation of oxygen ions, which means that it is possible to use a bulk aluminum material as an X-ray absorber of a sensor element, and it is possible to obtain an X-ray sensor element having high detection efficiency.

Also, by making the barrier anodizing coating formed after anodizing an insulation film it is possible to form a tunnel junction region and a high quality tunnel oxidation film at the same time by irradiating an oxygen ion beam converged on the insulation film.

What is claimed is:

1. A method of forming a tunnel oxidation film by anodizing a bulk aluminum material and then forming a tunnel oxidation film by irradiating oxygen ions.

2. A method of forming a tunnel oxidation film by electropolishing a bulk aluminum material, performing anodizing to form a barrier oxidation coating, and then forming a tunnel oxidation film by irradiation of oxygen ions.

3. A method of forming a tunnel oxidation film for carrying out formation of a tunnel junction region and formation of a tunnel oxidation film at the same time by forming a barrier oxidation film as an insulation film on a surface of a bulk aluminum material by anodizing, and irradiating an oxygen ion beam on the surface of the insulating film.

* * * * *